United States Patent
Suzuki et al.

(10) Patent No.: US 7,892,358 B2
(45) Date of Patent: Feb. 22, 2011

(54) SYSTEM FOR INTRODUCING A PRECURSOR GAS TO A VAPOR DEPOSITION SYSTEM

(75) Inventors: Kenji Suzuki, Guilderland, NY (US); Atsushi Gomi, Rennselaer, NY (US)

(73) Assignee: Tokyo Electron Limited, Tokyo (JP)

( * ) Notice: Subject to any disclaimer, the term of this patent is extended or adjusted under 35 U.S.C. 154(b) by 1198 days.

(21) Appl. No.: 11/277,913

(22) Filed: Mar. 29, 2006

(65) Prior Publication Data

US 2007/0234962 A1    Oct. 11, 2007

(51) Int. Cl.
C23C 16/06  (2006.01)
H01L 21/306  (2006.01)

(52) U.S. Cl. .............. 118/715; 156/345.33; 156/345.34

(58) Field of Classification Search ................. 118/715; 156/345.33, 345.34
See application file for complete search history.

(56) References Cited

U.S. PATENT DOCUMENTS

| | | | |
|---|---|---|---|
| 4,851,895 A | 7/1989 | Green et al. | |
| 4,929,468 A | 5/1990 | Mullendore | |
| 4,938,999 A | 7/1990 | Jenkin | |
| 5,171,610 A | 12/1992 | Liu | |
| 5,372,849 A | 12/1994 | McCormick et al. | |
| 5,884,009 A * | 3/1999 | Okase | 392/418 |
| 5,958,140 A * | 9/1999 | Arami et al. | 118/725 |
| 6,063,705 A | 5/2000 | Vaartstra | |
| 6,074,945 A | 6/2000 | Vaartstra et al. | |
| 6,245,192 B1 * | 6/2001 | Dhindsa et al. | 156/345.34 |
| 6,287,435 B1 | 9/2001 | Drewery et al. | |
| 6,303,809 B1 | 10/2001 | Chi et al. | |
| 6,319,832 B1 * | 11/2001 | Uhlenbrock et al. | 438/681 |
| 6,420,583 B1 | 7/2002 | Lienhard et al. | |
| 6,440,495 B1 | 8/2002 | Wade et al. | |
| 6,444,263 B1 | 9/2002 | Paranjpe et al. | |
| 6,605,735 B2 | 8/2003 | Kawano et al. | |
| 6,713,373 B1 | 3/2004 | Omstead | |
| 6,800,139 B1 * | 10/2004 | Shinriki et al. | 118/715 |
| 6,989,321 B2 | 1/2006 | Yamasaki et al. | |
| 7,078,341 B2 | 7/2006 | Yamasaki et al. | |
| 7,107,998 B2 | 9/2006 | Greer et al. | |
| 7,264,846 B2 | 9/2007 | Chang et al. | |

(Continued)

FOREIGN PATENT DOCUMENTS

CA    2206217    11/1998

(Continued)

OTHER PUBLICATIONS

C. Czekaj et al., Chemical Vapor Deposition of FeCox and FeCoxOy, Thin Films from Fe-Co Carbonyl Clusters, Inorg. Chem. 1988, 27, pp. 8-10.

(Continued)

*Primary Examiner*—Ram N Kackar
*Assistant Examiner*—Satish Chandra
(74) *Attorney, Agent, or Firm*—Wood, Herron & Evans, LLP

(57) ABSTRACT

A system for introducing a precursor vapor to a processing chamber configured for forming a thin metal on a substrate is described. The vapor delivery system includes means for introducing a dilution gas to the precursor vapor and adjusting the spatial distribution of the dilution gas addition in order to affect improvements to the properties of the deposited film.

14 Claims, 7 Drawing Sheets

U.S. PATENT DOCUMENTS

| | | | |
|---|---|---|---|
| 7,270,848 | B2 | 9/2007 | Suzuki et al. |
| 7,279,421 | B2 | 10/2007 | Suzuki |
| 7,285,308 | B2 | 10/2007 | Hendrix et al. |
| 7,345,184 | B2 | 3/2008 | Suzuki et al. |
| 7,459,396 | B2 | 12/2008 | Suzuki et al. |
| 2003/0129306 | A1 | 7/2003 | Wade et al. |
| 2004/0105934 | A1 | 6/2004 | Chang et al. |
| 2004/0238961 | A1 | 12/2004 | Cunningham |
| 2005/0070100 | A1* | 3/2005 | Yamasaki et al. ............ 438/685 |
| 2005/0081882 | A1* | 4/2005 | Greer et al. .................. 134/1.1 |
| 2005/0110142 | A1 | 5/2005 | Lane et al. |
| 2005/0186341 | A1 | 8/2005 | Hendrix et al. |

FOREIGN PATENT DOCUMENTS

| | | |
|---|---|---|
| EP | 0620291 A1 | 10/1994 |
| JP | 2002155366 A | 5/2002 |
| WO | 0012777 | 3/2000 |
| WO | 00/26432 | 5/2000 |
| WO | 01/16396 A1 | 3/2001 |
| WO | 2005034223 A1 | 4/2005 |
| WO | 2006104647 A2 | 10/2006 |

OTHER PUBLICATIONS

Boyd et al., Chemical Vapor Deposition of Metallic Thin Films Using Homonuclear and Heteronuclear Metal Carbonyls, Chemical Mater., vol. 9, 1997, pp. 1154-1158.

Bykov et al., Investigation of Thermal Properties of Ruthenium (III) B-Diketonate Precursors For Preparation of RuO2 Films by CVD, Journal of Thermal Analysis, vol. 46, 1996, pp. 1551-1565.

Cheng et al., Initial growth of chemical-vapor-deposited Ru from bis (hexafluoroacetylacetonate)dicarbonyl ruthenium, Thin Solid Films, vol. 483, 2005, pp. 31-37.

Gatineau et al., Deposition of highly pure ruthenium thin films with a new metal-organic precursor, Surface & Coatings Technol., vol. 201, 2007, pp. 9146-9148.

Green et al., Chemical Vapor Deposition of Ruthenium and Ruthenium Dioxide Films, J. Electrochem. Soc., vol. 132 No. 11, Nov. 1985, pp. 2677-2685.

Wang et al., Low-temperature chemical vapor deposition and scaling limit of ultrathin Ru films, Applied Physics Ltrs., vol. 84, No. 8, Feb. 23, 2004, pp. 1380-1382.

U.S. Patent and Trademark Office, Non-final Office Action received in related U.S. Appl. No. 10/856,941, dated Mar. 25, 2009, 14 pp.

U.S. Patent and Trademark Office, Non-final Office Action received in related U.S. Appl. No. 11/277,911 dated Jan. 26, 2009, 26 pp.

Taiwanese Office Action, Notice of Examination received in Application #94142050, dated Oct. 28, 2008, 11 pp.

U.S. Patent and Trademark Office, Non-final Office Action received in related U.S. Appl. No. 11/771,262, dated May 15, 2009, 6 pp.

International Search Report & Written Opinion, PCT/US2005/035582, dated Aug. 8, 2006, 9pp.

International Search Report & Written Opinion, PCT/US2006/007675, dated Oct. 13, 2006, 9 pp.

U.S. Patent and Trademark Office, Non-final Office Action received in related U.S. Appl. No. 10/996,145, dated Jul. 20, 2005, 16pp.

U.S. Patent and Trademark Office, Final Office Action received in related U.S. Appl. No. 10/996,145, dated Jan. 31, 2006, 10pp.

U.S. Patent and Trademark Office, Advisory Action received in related U.S. Appl. No. 10/996,145, dated Jul. 10, 2006, 3pp.

U.S. Patent and Trademark Office, Non-final Office Action received in related U.S. Appl. No. 10/996,145, dated Sep. 5, 2006, 14 pp.

European Patent Office, International Search Report and Written Opinion received in corresponding PCT Application No. PCT/US2007/064466, dated Aug. 22, 2007, 8 pgs.

* cited by examiner

SYSTEM FOR INTRODUCING A PRECURSOR GAS TO A VAPOR DEPOSITION SYSTEM

CROSS REFERENCE TO RELATED APPLICATIONS

The present invention is related to commonly-owned pending U.S. patent application Ser. No. 11/277,911, entitled "METHOD FOR INTRODUCING A PRECURSOR GAS TO A VAPOR DEPOSITION SYSTEM" and filed on even date herewith; commonly-owned U.S. patent application Ser. No. 10/996,145, now U.S. Pat. No. 7,270,848 issued Sep. 18, 2007, and entitled "METHOD FOR INCREASING DEPOSITION RATES OF METAL LAYERS FROM METAL-CARBONYL PRECURSORS"; and commonly-owned U.S. patent application Ser. No. 10/996,144, now U.S. Pat. No. 7,279,421 issued Oct. 9, 2007, and entitled "METHOD AND DEPOSITION SYSTEM FOR INCREASING DEPOSITION RATES OF METAL LAYERS FROM METAL-CARBONYL PRECURSORS", the entire contents of which are herein incorporated by reference.

BACKGROUND OF THE INVENTION

1. Field of Invention

The present invention relates to a system for thin film deposition, and more particularly to a system for improving the uniformity of metal layers formed from metal carbonyl precursors.

2. Description of Related Art

The introduction of copper (CU) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperature between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electro-chemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractive metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of ruthenium carbonyl precursors (e.g., $Ru_3(CO)_{12}$) can deteriorate when the substrate temperature is lowered to below about 400° C. As a result, an increase in the (electrical) resistivity of the Ru layers and poor surface morphology (e.g., the formation of nodules) at low deposition temperatures has been attributed to increased incorporation of reaction by-products into the thermally deposited Ru layers. Both effects can be explained by a reduced carbon monoxide (CO) desorption rate from the thermal decomposition of the ruthenium carbonyl precursor at substrate temperatures below about 400° C.

Additionally, the use of metal carbonyls, such as ruthenium carbonyl or rhenium carbonyl, can lead to poor deposition rates due to their low vapor pressure, and the transport issues associated therewith. Overall, the inventors have observed that current deposition systems suffer from such a low rate, making the deposition of such metal films impractical. Furthermore, the inventors have observed that current deposition systems suffer from poor film uniformity.

SUMMARY OF THE INVENTION

A method and system is provided for improving the transport of precursor vapor in a thin film deposition system.

According to one embodiment, a deposition system for forming a thin metal film on a substrate is described, comprising: a process chamber having a substrate holder configured to support the substrate and heat the substrate, and a pumping system configured to evacuate the process chamber; a metal precursor vaporization system configured to evaporate a metal carbonyl precursor to form a metal carbonyl precursor vapor; a vapor distribution system configured to introduce the metal carbonyl precursor vapor above the substrate and a dilution gas above the substrate, wherein the vapor distribution system is configured to adjust a distribution of the partial pressure of the dilution gas above the substrate; a dilution gas source coupled to the vapor distribution system and configured to supply the dilution gas to the vapor distribution system; a vapor delivery system having a first end coupled to an outlet of the metal carbonyl precursor vaporization system and a second end coupled to an inlet of the vapor distribution system of the process chamber; a gas supply system coupled to at least one of the metal precursor vaporization system or the vapor delivery system, or both, and configured to supply a CO gas to transport the metal precursor vapor in the CO gas to the inlet of the vapor distribution system.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
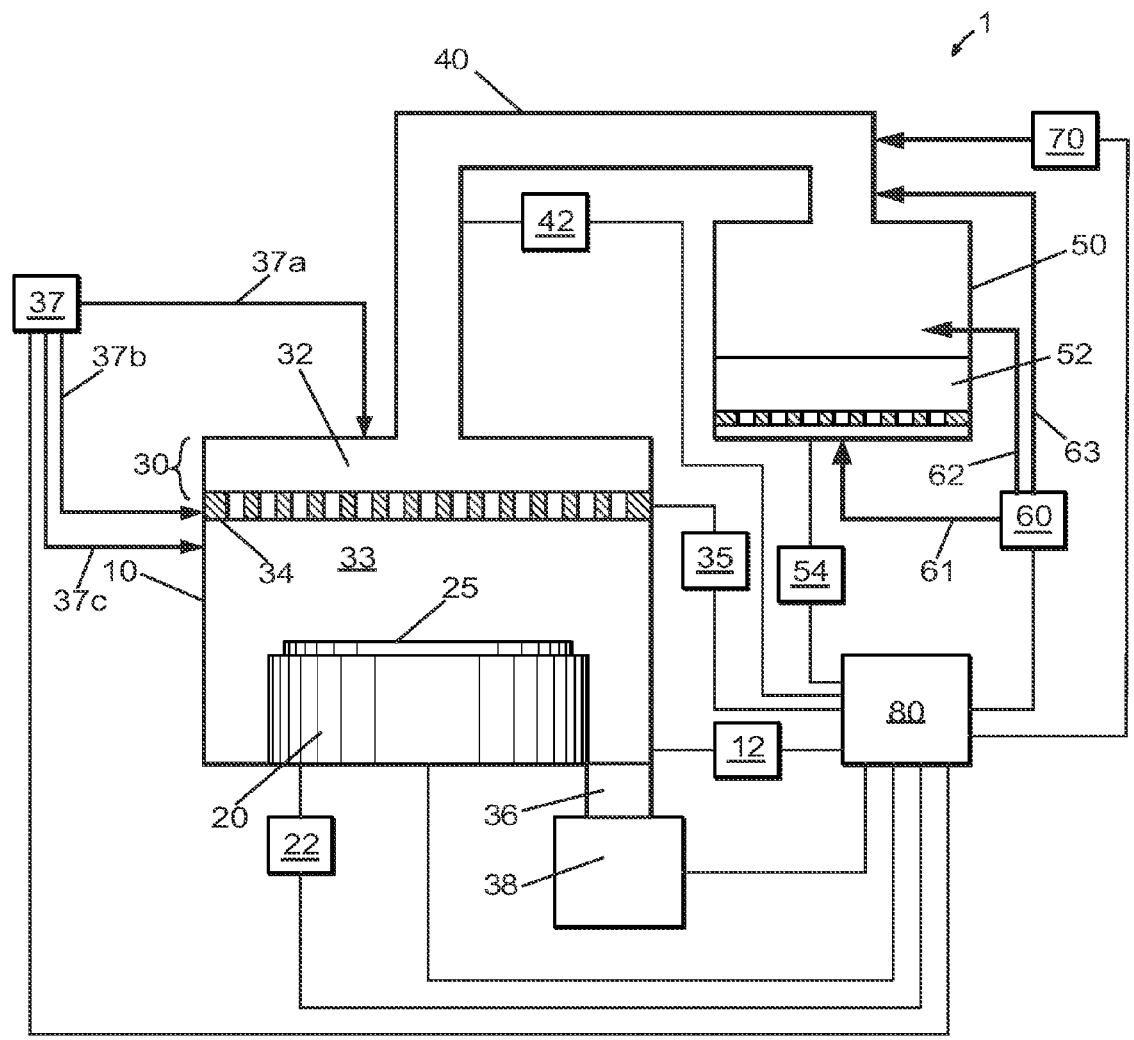
FIG. 1 depicts a schematic view of a deposition system according to an embodiment of the invention.

Referring now to the drawings, wherein like reference numerals designate identical or corresponding parts throughout the several views, FIG. 1 schematically illustrates a thermal chemical vapor deposition system 1 for depositing a metal layer on a substrate from a metal carbonyl precursor, according to one embodiment. While other metal carbonyl precursors may be used, embodiments of the invention may henceforth be described with particular reference to ruthenium carbonyl precursors, such as $Ru_3(CO)_{12}$, with the understanding that the invention is not so limited. The deposition system 1 comprises a process chamber 10 having a substrate holder 20 configured to support a substrate 25, upon which the metal layer is formed. The process chamber 10 is coupled to a metal precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the metal layer on the substrate 25, and suitable for evaporation (or sublimation) of the metal carbonyl precursor 52 in the metal precursor vaporization system 50.

Still referring to FIG. 1, the metal precursor vaporization system 50 is configured to store a metal carbonyl precursor 52, to heat the metal carbonyl precursor 52 to a temperature sufficient for vaporizing the metal carbonyl precursor 52, and to introduce metal carbonyl precursor vapor to the vapor precursor delivery system 40. The metal carbonyl precursor 52 can be solid under the selected heating conditions in the metal precursor vaporization system 50. Alternately, the metal carbonyl precursor 52 can be a liquid. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. Below, the use of a solid metal carbonyl precursor 52 is described; however, those skilled in the art will appreciate that metal carbonyl precursors that are liquids under the selected heating conditions can be used without departing from the scope of the invention. For instance, the metal carbonyl precursor can have the general formula $M_x(CO)_y$, and can comprise a tungsten carbonyl, a molybdenum carbonyl, a cobalt carbonyl, a rhodium carbonyl, a rhenium carbonyl, a chromium carbonyl, or an osmium carbonyl, or a combination of two or more thereof. These metal carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

In order to achieve the desired temperature for vaporizing the metal carbonyl precursor 52 (e.g., subliming the solid metal carbonyl precursor 52), the metal precursor vaporization system 50 is coupled to a vaporization temperature control system 54 configured to control the vaporization temperature. For instance, the temperature of the metal carbonyl precursor 52 is generally elevated to approximately 40° C. to 45° C. in conventional systems in order to sublime the ruthenium carbonyl $Ru_3(CO)_{12}$. At this temperature, the vapor pressure of the $Ru_3(CO)_{12}$, for instance, ranges from approximately 1 to approximately 3 mTorr. As the metal carbonyl precursor is heated to cause evaporation (or sublimation), a carrier gas can be passed over or through the metal carbonyl precursor 52, or any combination thereof. The carrier gas can include, for example, an inert gas, such as a noble gas, He, Ne, Ar, Kr, or Xe, or a combination of two or more thereof. Alternately, other embodiments contemplate omitting the inert carrier gas.

According to an embodiment of the invention, a CO gas can be added to the inert carrier gas. Alternately, other embodiments contemplate the CO gas replacing the inert carrier gas. For example, a gas supply system 60 is coupled to the metal precursor vaporization system 50, and it is configured to, for instance, supply a carrier gas, a CO gas, or a mixture thereof, beneath the metal carbonyl precursor 52 via feed line 61, or over the metal carbonyl precursor 52 via feed line 62. In addition, or in the alternative, the gas supply system 60 is coupled to the vapor precursor delivery system 40 downstream from the metal precursor vaporization system 50 to supply the gas to the vapor of the metal carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the inert carrier gas can be between about 0.1 standard cubic centimeters per minute (sccm) and about 1000 sccm. Alternately, the flow rate of the inert carrier gas can be between about 10 sccm and about 500 sccm. Still alternately, the flow rate of the inert carrier gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 100 sccm.

Downstream from the metal precursor vaporization system 50, the metal precursor vapor flows with the CO gas and optional inert carrier gas through the vapor delivery system 40 until it enters a vapor distribution system 30 coupled to or within the process chamber 10. The vapor delivery system 40 can be coupled to a vapor line temperature control system 42 in order to control the vapor line temperature and prevent decomposition of the metal precursor vapor as well as condensation of the metal precursor vapor. For example, the vapor line temperature can be set to a value approximately equal to or greater than the vaporization temperature. Additionally, for example, the vapor delivery system 40 can be characterized by a high conductance in excess of about 50 liters/second.

Referring again to FIG. 1, the vapor distribution system 30, coupled to the process chamber 10, comprises a plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

According to an embodiment of the invention, a dilution gas source 37 is coupled to the process chamber 10 and/or vapor distribution system 30 and is configured to add a dilution gas to dilute the process gas containing the metal carbonyl precursor vapor and the CO gas. As shown in FIG. 1, the dilution gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the dilution gas source 37 can be coupled to the process chamber 10 via feed line 37b and configured to add the dilution gas to the process gas in the processing zone 33 above the substrate 25 after the process gas passes through the vapor distribution plate 34. Still alternately, the dilution gas source 37 can be coupled to the vapor distribution system 30 via feed line 37c and configured to add the dilution gas to the process gas in the distribution plate 34. As will be appreciated by those skilled in the art, the dilution gas can be added to the process gas at other locations in the vapor distribution system 30 and the process chamber 10 without departing from the scope of the invention.

In yet another embodiment, the dilution gas is introduced to the process gas from the dilution gas source 37 through one of feed lines 37a, 37b, 37c, or other feed lines (not shown) in such a way that the concentration of dilution gas at one region above substrate 25 can be adjusted to be different than the concentration of dilution gas at another region above substrate 25. For example, the flow of dilution gas to a central region of substrate 25 can be different than the flow of dilution gas to a peripheral region of substrate 25.

Once metal precursor vapor enters the processing zone 33, the metal precursor vapor thermally decomposes upon adsorption at the substrate surface due to the elevated temperature of the substrate 25, and the thin metal film is formed on the substrate 25. The substrate holder 20 is configured to elevate the temperature of substrate 25 by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

As described above, for example, conventional systems have contemplated operating the metal precursor vaporization system 50, as well as the vapor delivery system 40, within a temperature range of approximately 40-45° C. for ruthenium carbonyl in order to limit metal vapor precursor decomposition and metal vapor precursor condensation. For example, the ruthenium carbonyl precursor can decompose at elevated temperatures to form by-products, such as those illustrated below:

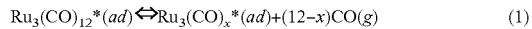  (1)

or,

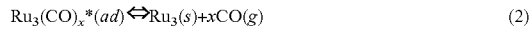  (2)

wherein these by-products can adsorb (ad), i.e., condense, on the interior surfaces of the deposition system 1. The accumulation of material on these surfaces can cause problems from one substrate to the next, such as process repeatability. Alternatively, for example, the ruthenium carbonyl precursor can condense at depressed temperatures to cause recrystallization, viz.

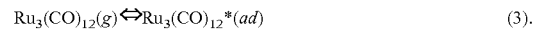  (3).

In summary, the low vapor pressure of some metal carbonyl precursors (e.g., $Ru_3(CO)_{12}$) and the small process window result in a very low deposition rate of a metal layer on the substrate 25.

Adding a CO gas to the metal carbonyl precursor vapor can reduce the above-mentioned problems that limit the delivery of the metal carbonyl precursor to the substrate. Thus, according to an embodiment of the invention, the CO gas is added to the metal carbonyl precursor vapor to reduce dissociation of the metal carbonyl precursor vapor in the gas line, thereby shifting the equilibrium in Equation (1) to the left and reducing premature decomposition of the metal carbonyl precursor in the vapor precursor delivery system 40 prior to delivery of the metal carbonyl precursor to the process chamber 10. It is believed that addition of the CO gas to the metal carbonyl precursor vapor allows for increasing the vaporization temperature from approximately 40° C. to approximately 150° C., or higher. The elevated temperature increases the vapor pressure of the metal carbonyl precursor, resulting in increased delivery of the metal carbonyl precursor to the process chamber and, hence, increased deposition rate of the metal on the substrate 25. Furthermore, it has been visually observed that flowing a mixture of an inert gas, such as Ar, and the CO gas over or through the metal carbonyl precursor reduces premature decomposition of the metal carbonyl precursor.

According to an embodiment of the invention, the addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Thermal decomposition of metal carbonyl precursors and subsequent metal deposition on the substrate 25 is thought to proceed predominantly by CO elimination and desorption of CO by-products from the substrate 25. Incorporation of CO by-products into the metal layers during deposition can result from incomplete decomposition of the metal carbonyl precursor, incomplete removal of CO by-products from the metal layer, and re-adsorption of CO by-products from the process chamber 10 onto the metal layer.

It is believed that CO incorporation into a metal layer during deposition leads to surface roughness in the form of nodules in the metal layer, where the growth of nodules is enhanced by increased incorporation of CO by-products into the metal layer. The number of nodules is expected to increase as the thickness of the metal layer increases. Furthermore, the incorporation of CO by-products into the metal layer increases the resistivity of the metal layer.

Incorporation of CO by-products into the metal layer can be reduced by (1) lowering the process pressure, and (2) increasing the substrate temperature. In accordance with the present invention, it has been realized that the above-mentioned problems can also be reduced by adding a dilution gas in the process chamber 10 to the process gas containing the metal carbonyl precursor vapor and the CO gas for controlling and reducing the partial pressure of by-products and the CO gas in the process chamber. Thus, according to an embodiment of the invention, a dilution gas from dilution gas source 37 is added to the process gas for controlling and reducing the partial pressure of CO by-products on the metal layer and the partial pressure of CO in the process chamber 10, thereby forming a smooth metal layer. The dilution gas can include, for example, an inert gas, such as a noble gas, He, Ne, Ar, Kr, or Xe, or a mixture of two or more thereof. The dilution gas may further contain a reducing gas to improve the material properties of the metal layer, for example the electrical resistivity. The reducing gas can, for example, contain $H_2$, a silicon-containing gas (e.g., $SiH_4$, $Si_2H_6$, or $SiCl_2H_2$), a boron-containing gas (e.g., $BH_3$, $B_2H_6$, or $B_3H_9$), or a nitrogen-containing gas (e.g., $NH_3$). According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Since the addition of the CO gas to the metal carbonyl precursor vapor increases the thermal stability of the metal carbonyl precursor vapor, the relative concentration of the metal carbonyl precursor vapor to the CO gas in the process gas can be utilized to control the decomposition rate of the metal carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired vaporization temperature of the metal carbonyl precursor and for achieving a desired deposition rate of the metal carbonyl precursor on the substrate 25.

Furthermore, the amount of CO gas in the process gas can be selected so that metal deposition on the substrate 25 from a metal carbonyl precursor occurs in a kinetic-limited temperature regime. For example, the amount of CO gas in the process gas can be increased until the metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on metal carbonyl precursor flow rate and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall. Step coverage is commonly defined as the sidewall coverage (metal layer thickness on sidewall divided by the metal layer thickness away from the feature) divided by the bottom coverage (metal layer thickness on the bottom of the feature divided by the metal layer thickness away from the feature).

As described above, the introduction of dilution gas to the process gas can be utilized for controlling and reducing the partial pressure of CO by-products on the metal layer and the partial pressure of CO in the process chamber 10 in order to prepare a thin metal film having desirable properties. However, the inventors have observed that the partial pressure of CO by-products, or the partial pressure of CO, or both, can vary across substrate 25, thus leading to non-uniform film properties. For instance, it is suspected that the edge temperature of conventional substrate holder 20 can be greater than the temperature of substrate 25. The higher edge temperature for substrate holder 20 can cause an increase in the production of CO by-products (as suggested above), which can diffuse to the peripheral edge of substrate 25 causing CO poisoning of the thin metal film formed proximate the peripheral edge of substrate 25. Therefore, in one example, as introduced above, the flow of dilution gas to the peripheral edge of substrate 25 can be adjusted relative to the flow of dilution gas to the central region of substrate 25 in order to adjust the relative dilution of CO and CO by-products.

Still referring to FIG. 1, optionally, the deposition system 1 can be periodically cleaned using an in-situ cleaning system 70 coupled to, for example, the vapor delivery system 40, as shown in FIG. 1. Per a frequency determined by the operator, the in-situ cleaning system 70 can perform routine cleanings of the deposition system 1 in order to remove accumulated residue on internal surfaces of deposition system 1. The in-situ cleaning system 70 can, for example, comprise a radical generator configured to introduce chemical radical capable of chemically reacting and removing such residue. Additionally, for example, the in-situ cleaning system 70 can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor delivery system 40, the film precursor vaporization system 50, the carrier gas supply system 60, the dilution gas source 37, and the optional in-situ cleaning system 70.

Figure 2:
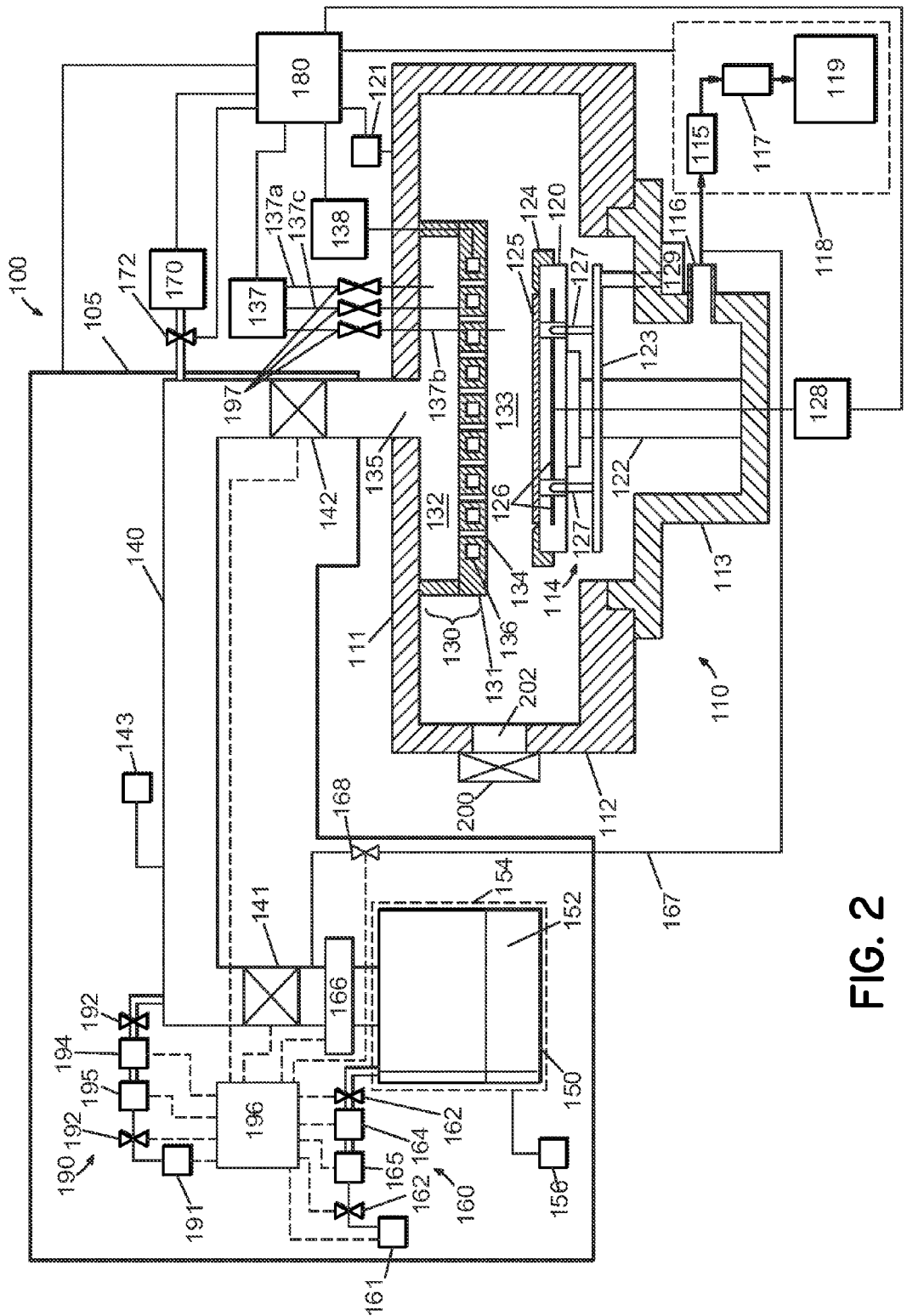
FIG. 2 depicts a schematic view of a deposition system according to another embodiment of the invention.

In another embodiment, FIG. 2 illustrates a deposition system 100 for depositing a metal film, such as a ruthenium (Ru) film, on a substrate. The deposition system 100 comprises a process chamber 110 having a substrate holder 120 configured to support a substrate 125 upon which the metal layer is formed. The process chamber 110 is coupled to a precursor delivery system 105 having metal precursor vaporization system 150 configured to store and evaporate a metal carbonyl precursor 152, and a vapor precursor delivery system 140 configured to transport the metal carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional guide ring 124 for positioning the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the metal carbonyl precursor vapor, and enable deposition of a metal layer on the substrate 125. According to an embodiment, the metal carbonyl precursor 152 can be a ruthenium carbonyl precursor, for example $Ru_3(CO)_{12}$. As will be appreciated by those skilled in the art of thermal chemical vapor deposition, other metal carbonyl precursors and other ruthenium carbonyl precursors can be used without departing from the scope of the invention. The substrate holder 120 is heated to a pre-determined temperature that is suitable for depositing the desired Ru metal layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 0.1 mtorr and about 200 mtorr. Alternately, the process chamber pressure can be between about 1 mtorr and about 100 mtorr. Still alternately, the process chamber pressure can be between about 2 mtorr and about 50 mtorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

According to an embodiment of the invention, a dilution gas source 137 is coupled to the process chamber 110 and is configured to add a dilution gas to dilute the process gas containing the metal carbonyl precursor vapor and the CO gas using feed lines 137a, 137b, and/or 137c, valves 197, one or more filters (not shown), and a mass flow controller (not shown). As shown in FIG. 2, the dilution gas source 137 can be coupled to the vapor distribution system 130 of process chamber 110 and is configured to add the dilution gas to the process gas in the vapor distribution plenum 132 via feed line 137a before the process gas passes through the vapor distribution plate 131 into the processing zone 133 above the substrate 125, or the dilution gas source 137 can be configured to add the dilution gas to the process gas inside the vapor distribution plate 131 via feed line 137c. Alternately, the dilution gas source 137 can be coupled to the process chamber 110 and is configured to add the dilution gas to the process gas in the processing zone 133 via feed line 137b after the process gas passes through the vapor distribution plate 131. As will be appreciated by those skilled in the art, the dilution gas can be added to the process gas at other locations in the process chamber 110 without departing from the scope of the invention.

In yet another embodiment, the dilution gas is introduced to the process gas from the dilution gas source 137 through one of feed lines 137a, 137b, 137c, or other feed lines (not shown) in such a way that the concentration of dilution gas at one region above substrate 125 can be adjusted to be different than the concentration of dilution gas at another region above substrate 125. For example, the flow of dilution gas to a central region of substrate 125 can be different than the flow of dilution gas to a peripheral region of substrate 125.

Furthermore, an opening 135 is provided in the upper chamber section 111 for introducing a metal carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the metal carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a metal precursor vaporization system 150 is configured to hold a metal carbonyl precursor 152 and evaporate (or sublime) the metal carbonyl precursor 152 by elevating the temperature of the metal carbonyl precursor. A precursor heater 154 is provided for heating the metal carbonyl precursor 152 to maintain the metal carbonyl precursor 152 at a temperature that produces a desired vapor pressure of metal carbonyl precursor 152. The precursor heater 154 is coupled to a vaporization temperature control system 156 configured to control the temperature of the metal carbonyl precursor 152. For example, the precursor heater 154 can be configured to adjust the temperature of the metal carbonyl precursor 152 from about 40° C. to about 150° C., or from about 60° C. to about 90° C.

As the metal carbonyl precursor 152 is heated to cause evaporation (or sublimation), a carrier gas can be passed over or through the metal carbonyl precursor 152, or any combination thereof. The carrier gas can include, for example, an inert gas, such as a noble gas (i.e., He, Ne, Ar, Kr, Xe). Alternately, other embodiments contemplate omitting the inert carrier gas. According to an embodiment of the invention, a CO gas can be added to the inert carrier gas. Alternately, other embodiments contemplate the CO gas replacing the inert carrier gas. For example, a gas supply system 160 is coupled to the metal precursor vaporization system 150, and it is configured to, for instance, flow the carrier gas, the CO gas, or both, over or through the metal carbonyl precursor 152. Although not shown in FIG. 2, gas supply system 160 can also or alternatively be coupled to the vapor precursor delivery system 140 to supply the CO gas and optional inert carrier gas to the vapor of the metal precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of inert carrier gas or the CO gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of metal carbonyl precursor vapor delivered to the process chamber 110 can be determined using sensor 166 and mass flow controller 165. Alternately, the sensor 166 can comprise a light absorption sensor to measure the concentration of the metal carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the metal carbonyl precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the metal carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the metal carbonyl precursor vapor in the vapor precursor delivery system, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the metal carbonyl precursor vapor. Sensor 166 is also connected to controller 196 and, based on output of the sensor 166, controller 196 can control the carrier gas flow through mass flow controller 165 to obtain the desired metal carbonyl precursor flow to the process chamber 110.

Furthermore, as described above, and as shown in FIG. 2, an optional in-situ cleaning system 170 is coupled to the precursor delivery system 105 of deposition system 100 through cleaning valve 172. For instance, the in-situ cleaning system 170 can be coupled to the vapor delivery system 140. The in-situ cleaning system 170 can, for example, comprise a radical generator configured to introduce chemical radical capable of chemically reacting and removing such residue. Additionally, for example, the in-situ cleaning system 170 can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $ClF_3$, $O_3$, $XeF_2$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted metal carbonyl precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, metal precursor vaporization system 150, gas supply system 190, gas supply system 160, and vaporization temperature control system 156; vapor distribution temperature control system 138; dilution gas source 137; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via the internet or an intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 3:
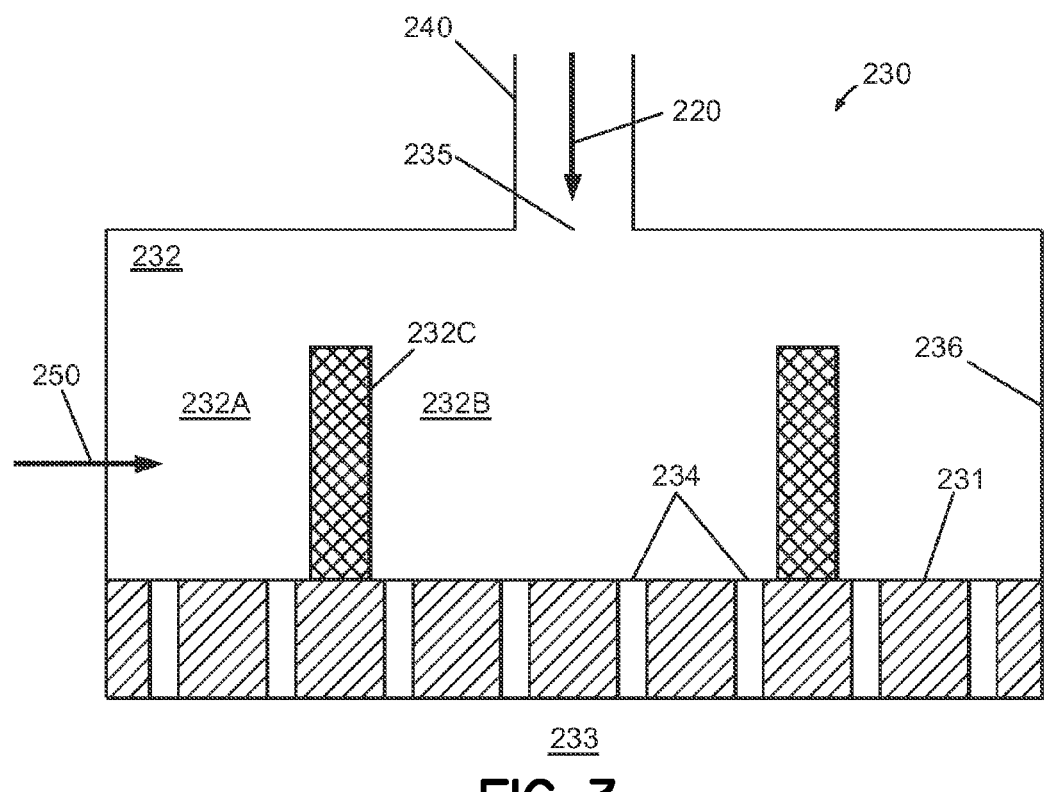
FIGS. 3-7 depict schematic cross-sectional views of gas injection systems according to various alternate embodiments of the invention.

Referring now to FIG. 3, a vapor distribution system 230 is illustrated in accordance with one embodiment of the present invention. The vapor distribution system 230 comprises a housing 236 configured to be coupled to or within a process chamber of a deposition system (such as process chamber 10 or 110 of deposition system 1 or 100, respectively), and a vapor distribution plate 231 configured to be coupled to the housing 236, wherein the combination form a plenum 232. The vapor distribution system 230 is configured to receive a process gas 220 into the plenum 232 from vapor delivery system 240 through opening 235. The vapor distribution plate 231 comprises a plurality of orifices 234 arranged to introduce and distribute the process gas 220 from plenum 232 to a process space 233 proximate a substrate (not shown) upon which a metal film is to be formed.

In addition, the vapor distribution system 230 is configured to receive a dilution gas 250 from a dilution gas source (not shown) into plenum 232, hence, permitting the process gas 220 and the dilution gas 250 to mix in the plenum 232. Thereafter, the mixture of the dilution gas 250 and the process gas 220 is distributed into process space 233 via the vapor distribution plate 231.

In a further embodiment illustrated in FIG. 3, the plenum 232 is partitioned, for example, into peripheral plenum region 232A and central plenum region 232B using an optional partition 232C such that only a select region or regions (e.g., peripheral plenum region 232A) of plenum 232 receives dilution gas 250. The dilution gas 250 can, for example, include an inert gas, such as Ar, or any one of the dilution gases presented above. It may be appreciated that a plurality of partitions and dilution gas feed locations into the plenum 232 can create any number of desired regions for creating varying dilution gas concentration in the process gas 220 as it is distributed into the process space 233.

Figure 4:
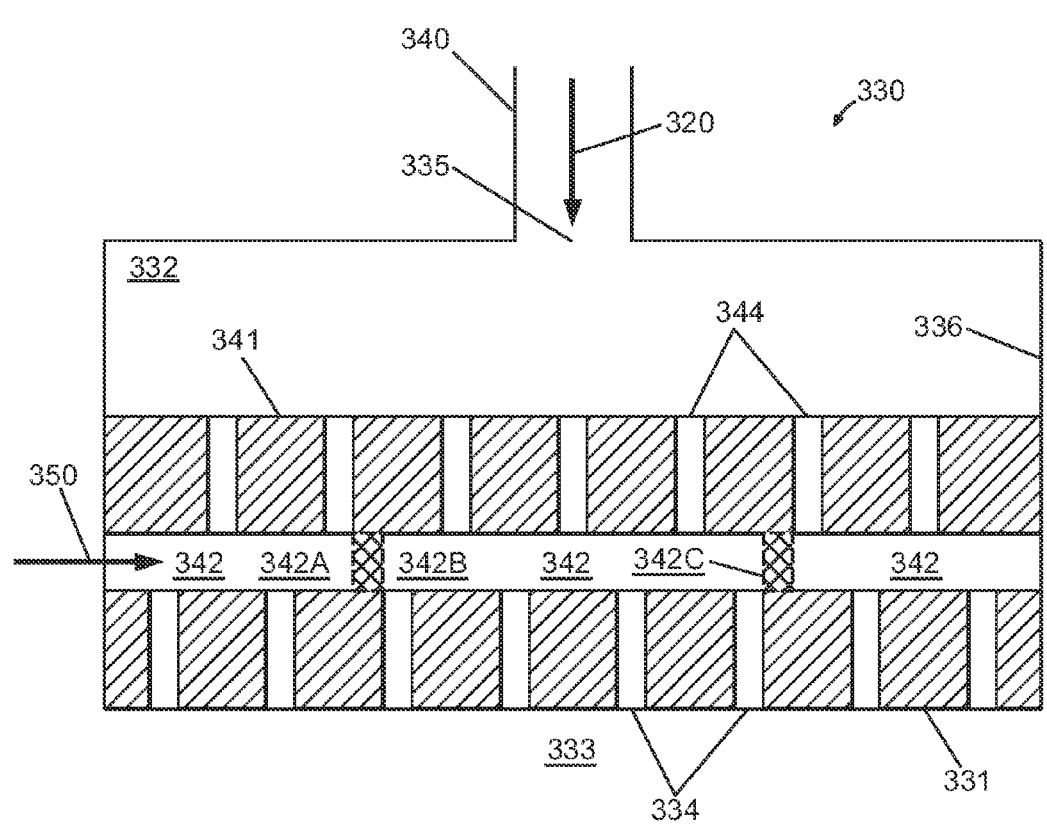

Referring now to FIG. 4, a vapor distribution system 330 is illustrated in accordance with another embodiment of the present invention. The vapor distribution system 330 comprises a housing 336 configured to be coupled to or within a process chamber of a deposition system (such as process chamber 10 or 110 of deposition system 1 or 100, respectively), a vapor distribution plate 331 configured to be coupled to housing 336, and an intermediate vapor distribution plate 341 configured to be coupled to housing 336 between opening 335 and vapor distribution plate 331, wherein the combination of housing 336, vapor distribution plate 331 and intermediate vapor distribution plate 341 form a plenum 332 between opening 335 and intermediate vapor distribution plate 341, and an intermediate plenum 342 between distribution plates 331 and 341, as shown in FIG. 4. The vapor distribution system 330 is configured to receive a process gas 320 into plenum 332 from vapor delivery system 340 through opening 335. The intermediate vapor distribution plate 341 comprises a plurality of orifices 344 arranged to introduce the process gas 320 in plenum 332 to the intermediate plenum 342. The vapor distribution plate 331 comprises a plurality of orifices 334 arranged to introduce and distribute the process gas 320 from intermediate plenum 342 to a process space 333 proximate a substrate (not shown) upon which a metal film is to be formed.

In addition, the vapor distribution system 330 is configured to receive a dilution gas 350 from a dilution gas source (not shown) into the intermediate plenum 342, hence, permitting the process gas 320 and the dilution gas 350 to mix in the intermediate plenum 342. Thereafter, the mixture of the dilution gas 350 and the process gas 320 is distributed into process space 333 via the vapor distribution plate 331. The dilution gas 350 can, for example, include an inert gas, such as Ar, or any one of the dilution gases presented above.

In a further embodiment, the intermediate plenum 342 is partitioned, for example, into peripheral plenum region 342A and central plenum region 342B using an optional partition 342C such that only a select region or regions (e.g., peripheral plenum region 342A) of intermediate plenum 342 receives dilution gas 350. In addition, in one embodiment, the plurality of orifices 344 in intermediate vapor distribution plate 341 are aligned with the plurality of orifices 334 in vapor distribution plate 331. In an alternate embodiment, depicted in FIG. 4, the plurality of orifices 344 in intermediate vapor distribution plate 341 are not aligned with the plurality of orifices 334 in vapor distribution plate 331.

Figure 5:
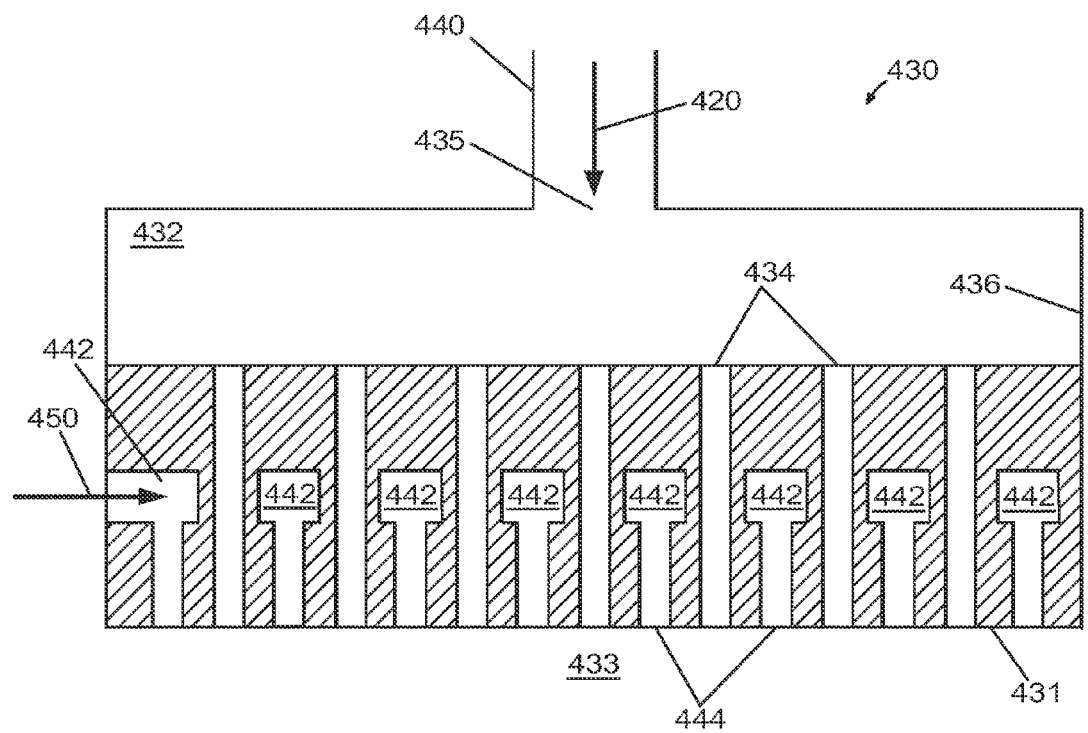

Referring now to FIG. 5, a vapor distribution system 430 is illustrated in accordance with another embodiment of the present invention. The vapor distribution system 430 comprises a housing 436 configured to be coupled to or within a process chamber of a deposition system (such as process chamber 10 or 110 of deposition system 1 or 100, respectively), and a multi-gas vapor distribution plate 431 configured to be coupled to the housing 436, wherein the combination form a plenum 432. The vapor distribution system 430 is configured to receive a process gas 420 into the plenum 432 from vapor delivery system 440 through opening 435. The multi-gas vapor distribution plate 431 comprises a first set of orifices 434 arranged to introduce and distribute the process gas 420 from plenum 432 to a process space 433 proximate a substrate (not shown) upon which a metal film is to be formed.

Additionally, the multi-gas vapor distribution plate 431 comprises a second set of orifices 444 coupled to an intermediate plenum 442 embedded within the multi-gas vapor distribution plate 431. The vapor distribution system 430 is configured to receive a dilution gas 450 from a dilution gas source (not shown) into the intermediate plenum 442, and to introduce dilution gas 450 from the intermediate plenum 442 into process space 433 for uniform mixing with the process gas 420 in the process space 433. The dilution gas 450 can, for example, include an inert gas, such as Ar, or any one of the dilution gases presented above.

Figure 6:
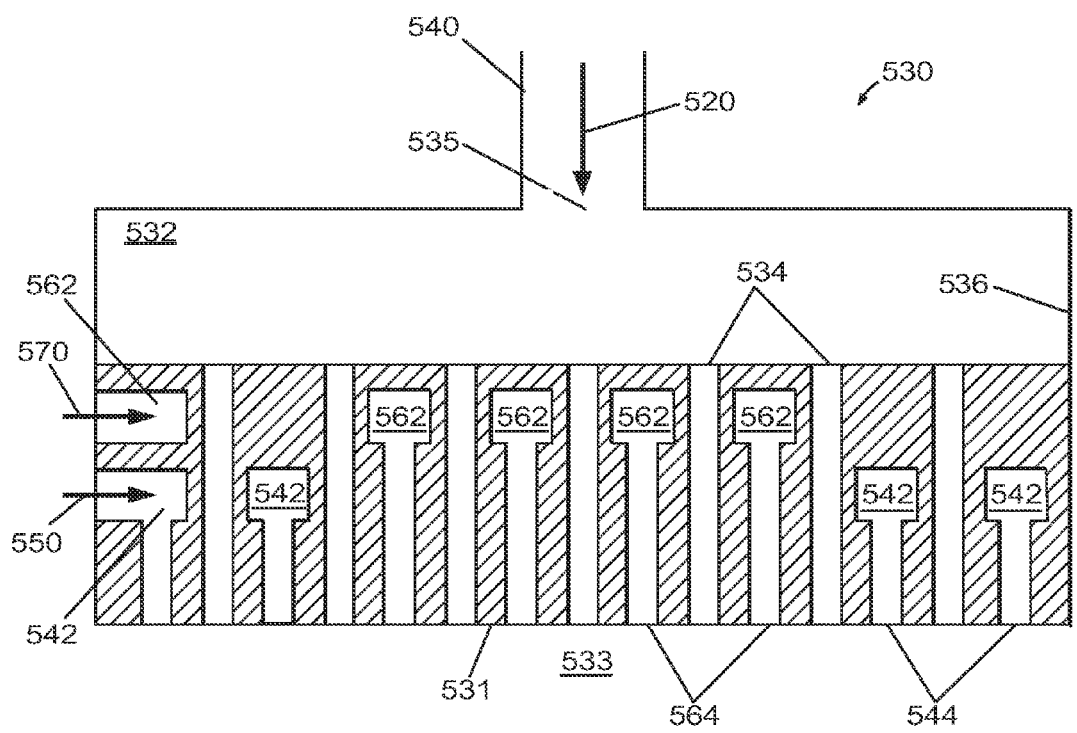

Referring now to FIG. 6, a vapor distribution system 530 is illustrated in accordance with another embodiment of the present invention. The vapor distribution system 530 comprises a housing 536 configured to be coupled to or within a process chamber of a deposition system (such as process chamber 10 or 110 of deposition system 1 or 100, respectively), and a multi-gas vapor distribution plate 531 configured to be coupled to the housing 536, wherein the combination form a plenum 532. The vapor distribution system 530 is configured to receive a process gas 520 into the plenum 532 from vapor delivery system 540 through opening 535. The multi-gas vapor distribution plate 531 comprises a first set of orifices 534 arranged to introduce and distribute the process gas 520 from plenum 532 to a process space 533 proximate a substrate (not shown) upon which a metal film is to be formed.

Additionally, the multi-gas vapor distribution plate 531 comprises a second set of peripheral orifices 544 coupled to an intermediate peripheral plenum 542 embedded within the multi-gas vapor distribution plate 531. The vapor distribution system 530 is configured to receive a first dilution gas 550 from a dilution gas source (not shown) into the intermediate peripheral plenum 542, and to introduce the first dilution gas 550 from the intermediate peripheral plenum 542 to a peripheral region in process space 533 substantially above a peripheral region of the substrate, for mixing of the first dilution gas 550 with the process gas 520 in the peripheral region. Furthermore, the multi-gas vapor distribution plate 531 comprises a third set of orifices 564 coupled to an intermediate central plenum 562 embedded within the multi-gas vapor distribution plate 531. The vapor distribution system 530 is further configured to receive a second dilution gas 570 from a dilution gas source (not shown) into the intermediate central plenum 562, and to introduce the second dilution gas 570 from the intermediate central plenum 562 to a central region in process space 533 above a central region of the substrate, for mixing of the second dilution gas 570 with the process gas 520 in the central region. The flow rate of the first dilution gas 550 and the flow rate of the second dilution gas 570 may be varied relative to one another in order to affect changes in the uniformity of the metal film deposited on the substrate. The first dilution gas 550 and the second dilution gas 570 can, for example, include an inert gas, such as Ar, or any one of the dilution gases presented above.

Figure 7:
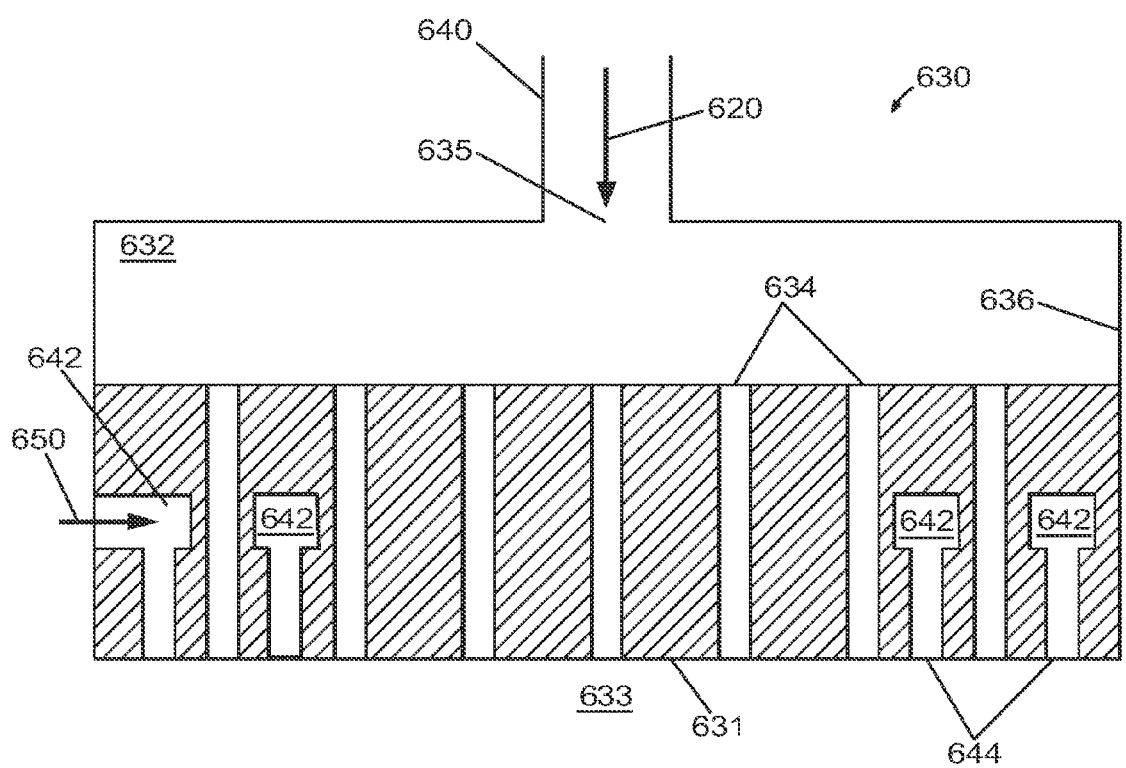

Referring now to FIG. 7, a vapor distribution system 630 is illustrated in accordance with another embodiment of the present invention. The vapor distribution system 630 comprises a housing 636 configured to be coupled to or within a process chamber of a deposition system (such as process chamber 10 or 110 of deposition system 1 or 100, respectively), and a multi-gas vapor distribution plate 631 configured to be coupled to the housing 636, wherein the combination form a plenum 632. The vapor distribution system 630 is configured to receive a process gas 620 into the plenum 632 from vapor delivery system 640 through opening 635. The multi-gas vapor distribution plate 631 comprises a first set of orifices 634 arranged to introduce and distribute the process gas 620 from the plenum 632 to a process space 633 proximate a substrate (not shown) upon which a metal film is to be formed.

Additionally, the multi-gas vapor distribution plate 631 comprises a second set of peripheral orifices 644 coupled to an intermediate peripheral plenum 642 embedded within the multi-gas vapor distribution plate 631. The vapor distribution system 630 is configured to receive a dilution gas 650 from a dilution gas source (not shown) into the intermediate peripheral plenum 642, and to introduce the dilution gas 650 from the intermediate peripheral plenum 642 to a peripheral region in process space 633 substantially above a peripheral region of the substrate, for mixing of the dilution gas 650 with the process gas 520 in the peripheral region. The dilution gas 650 can, for example, include an inert gas, such as Ar, or any one of the dilution gases presented above.

Figure 8:
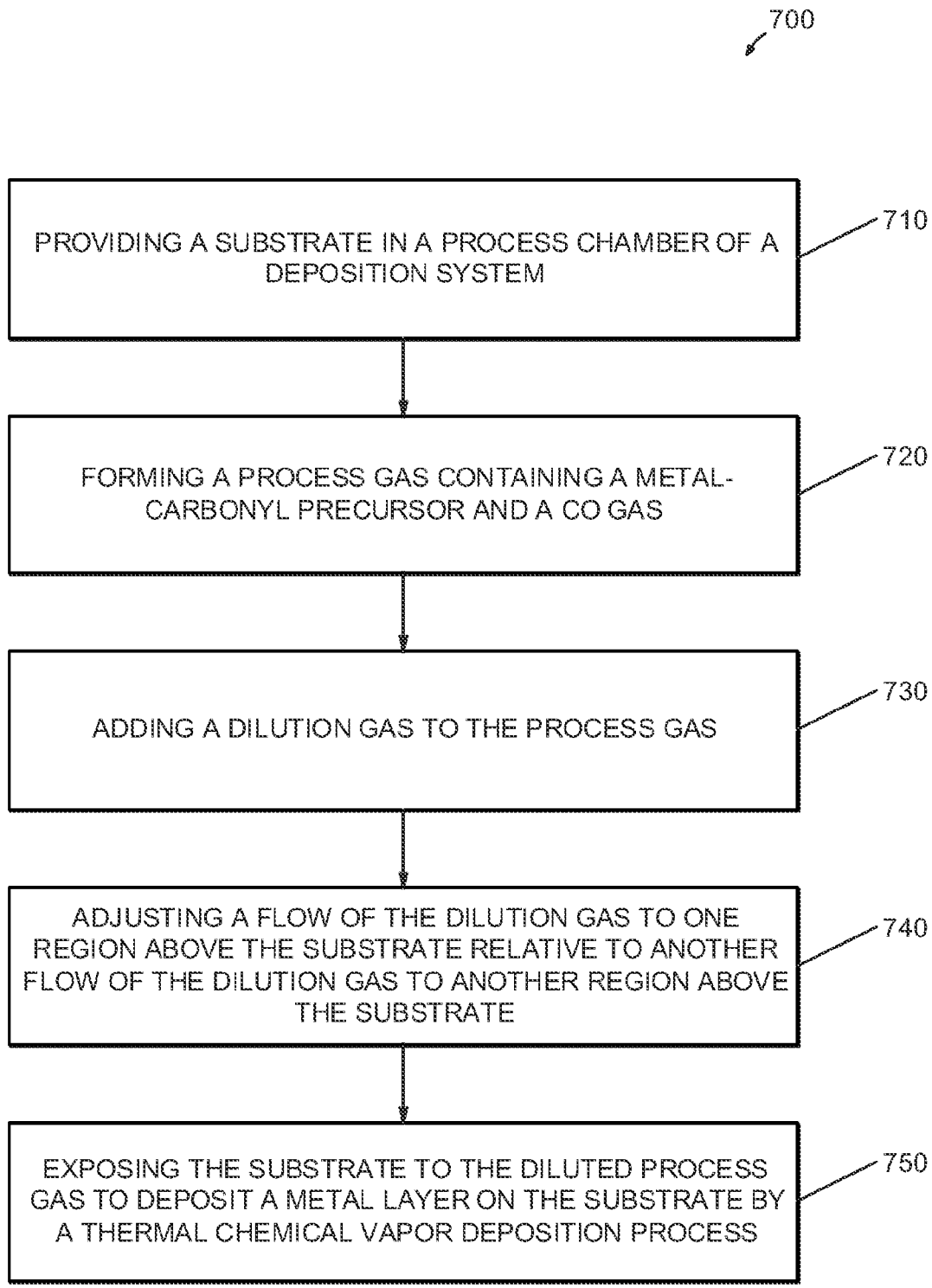
FIG. 8 is a process flow diagram illustrating a method of depositing a metal layer on a substrate according to an embodiment of the invention.

FIG. 8 illustrates a method of depositing a metal layer on a substrate according to an embodiment of the invention. The method 700 includes, at 710, providing a substrate in a process chamber of a deposition system. For example, the deposition system can include the depositions systems described above in FIGS. 1 and 2. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof.

At 720, a process gas containing a metal carbonyl precursor vapor and a CO gas is formed. The process gas can further contain an inert carrier gas. As described above, according to one embodiment, the metal carbonyl precursor can be a ruthenium carbonyl precursor, for example $Ru_3(CO)_{12}$. Addition of the CO gas to the metal carbonyl precursor vapor allows for increasing the vaporization temperature of the metal carbonyl precursor. The elevated temperature increases the vapor pressure of the metal carbonyl precursor, resulting in increased delivery of the metal carbonyl precursor to the process chamber and, hence, increased deposition rate of the metal on a substrate.

According to an embodiment of the invention, the process gas can be formed by heating a metal carbonyl precursor to form the metal carbonyl precursor vapor, and mixing the CO gas with the metal carbonyl precursor vapor. According to an embodiment of the invention, the CO gas can be mixed with the metal carbonyl precursor vapor downstream from the metal carbonyl precursor, for example, in the vapor precursor delivery system 40 or 140. According to another embodiment of the invention, the CO gas can be mixed with the metal carbonyl precursor vapor by flowing the CO gas over or through the metal carbonyl precursor, for example, in the metal precursor vaporization system 50 or 150. According to yet another embodiment of the invention, the process gas can be formed by additionally flowing an inert carrier gas over or through the metal carbonyl precursor.

At 730, a dilution gas is added to the process gas downstream of the vapor delivery system, and more specifically, in the process chamber and/or the vapor distribution system, to form a diluted process gas. As described in FIGS. 1 and 2, the dilution gas can be added to the process gas in a vapor distribution plenum before the process gas passes through a vapor distribution plate into a processing zone above the substrate. Alternately, the dilution gas can be added to the process gas in the processing zone above the substrate after the process gas flows through the vapor distribution plate. Still alternately, the dilution gas can be added to the process gas in the vapor distribution plate.

At 740, which may coincide with 730, the dilution gas is introduced to the process gas in such a way that the concentration of dilution gas at one region above the substrate can be adjusted to be different than the concentration of dilution gas at another region above the substrate. In one example, the flow of dilution gas to a central region of the substrate can be different than the flow of dilution gas to a peripheral region of the substrate. In another example, the flow of dilution gas exists only to the peripheral region of the substrate, while there exists no flow of dilution gas to the central region of the substrate. Adjusting the relative dilution of process gas at the center of the substrate relative to the peripheral region of the substrate can facilitate tailoring the film properties of the thin film across the substrate.

At 750, the substrate is exposed to the diluted process gas to deposit a metal layer on the substrate by a thermal chemical vapor deposition process. According to an embodiment of the invention, the metal layer can be deposited at a substrate temperature between about 50° C. and about 500° C. Alternately, the substrate temperature can be between about 300° C. and about 400° C.

As would be appreciated by those skilled in the art, each of the steps or stages in the flowchart of FIG. 8 may encompass one or more separate steps and/or operations. Accordingly, the recitation of only five steps in 710, 720, 730, 740, and 750 should not be understood to limit the method of the present invention solely to five steps or stages. Moreover, each representative step or stage 710, 720, 730, 740, 750 should not be understood to be limited to only a single process.

Figure 9A:
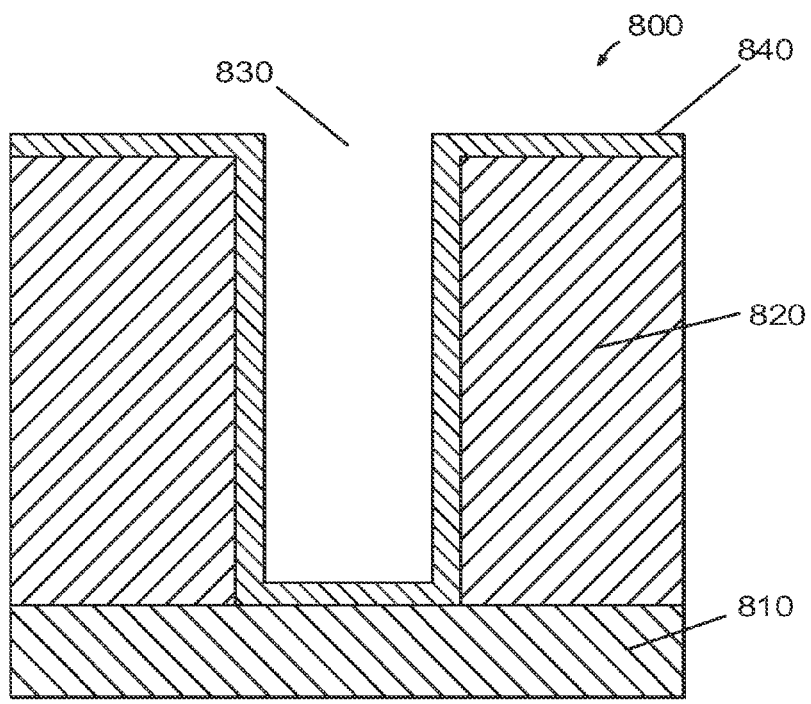
FIGS. 9A through 9C schematically show, in cross-sectional views, formation of a metal layer on a patterned substrate according to embodiments of the invention.
Figure 9B:
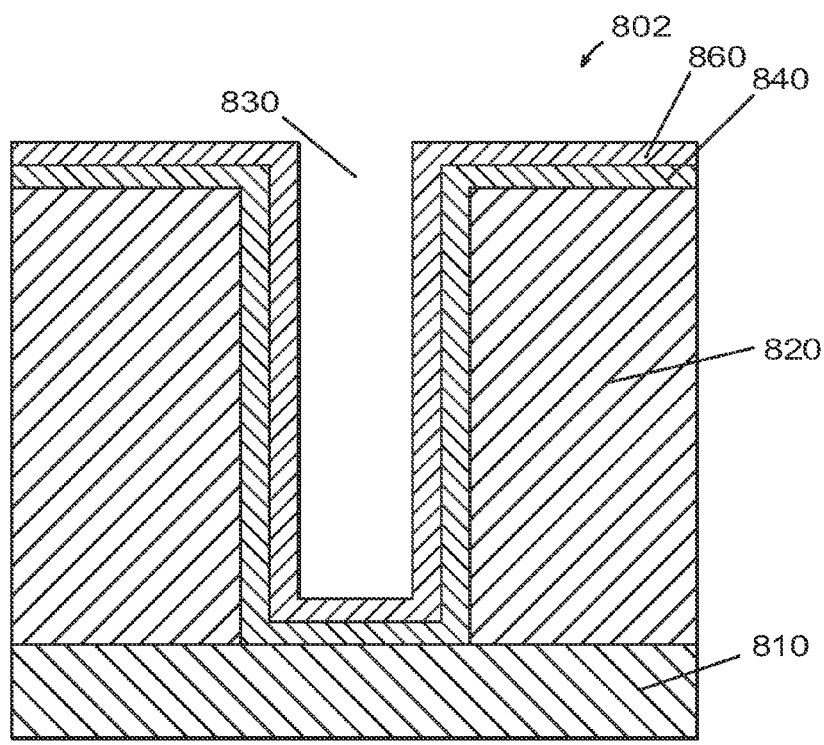
Figure 9C:
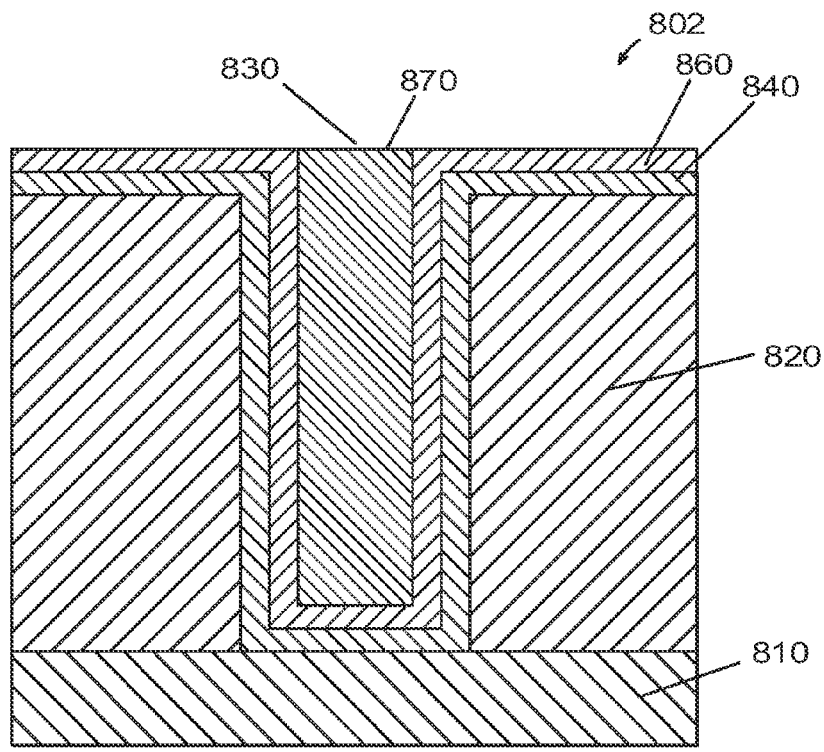

FIGS. 9A-9C schematically show formation of a metal layer on a patterned substrate according to embodiments of the invention. As those skilled in the art will readily appreciate, embodiments of the invention can be applied to patterned substrates containing one or more vias or trenches, or combinations thereof. FIG. 9A schematically shows deposition of a metal layer 840 onto a patterned structure 800 according to an embodiment of the invention. The patterned structure 800 contains a first metal layer 810, and a patterned layer 820 containing an opening 830. The patterned layer 820 can, for example, be a dielectric material. The opening 830 can, for example, be a via or a trench, and the metal layer 840 can, for example, contain Ru metal.

FIG. 9B schematically shows deposition of a metal layer 860 onto a patterned structure 802 according to another embodiment of the invention. The patterned structure 802 contains a first metal layer 810 and a patterned layer 820 containing an opening 830. A barrier layer 850 is deposited onto the patterned structure 802, and a metal layer 860 is deposited on the barrier layer 850. The barrier layer 850 can, for example, contain a tantalum-containing material (e.g., Ta, TaN, or TaCN, or a combination of two or more thereof) or a tungsten material (e.g., W, WN). The patterned layer 820 can, for example, be a dielectric material. The opening 830 can, for example, be a via or a trench, and the metal layer 860 can, for example, contain Ru metal. FIG. 9C schematically shows deposition of Cu in the opening 830 of FIG. 9B.

The metal layers 840 and 860 may be deposited, as described above, using a process gas comprising a metal carbonyl precursor, for example a ruthenium carbonyl, and carbon monoxide (CO). A dilution gas is mixed with the process gas downstream of the vapor delivery system in order to maintain the desired partial pressure of CO gas during transport of the precursor vapor through the vapor delivery system to the process system, yet reduce CO poisoning of the substrate in the process chamber. For example, the mixing may occur in a process space above the substrate in the process chamber; in a plenum of a vapor distribution system coupled to or within the process chamber; or within a vapor distribution plate of a vapor distribution system coupled to or within the process chamber, where the plate is configured to deliver the process gas from a plenum to a process space above the substrate in the process chamber. Further, the dilution gas may be mixed with the process gas only in a peripheral region of the process space, plenum, or distribution plate, or at a greater concentration in the peripheral region relative to a central region, to reduce CO poisoning at the peripheral edges (not shown) of patterned structures 800 and 802.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A deposition system for forming a metal layer on a substrate, comprising:
a process chamber having a substrate holder configured to support said substrate and heat said substrate, and a pumping system configured to evacuate said process chamber;
a metal precursor vaporization system configured to vaporize a metal carbonyl precursor to form a metal carbonyl precursor vapor;
a vapor distribution system coupled to or within said process chamber and configured to introduce said metal carbonyl precursor vapor to a process space above said substrate and a dilution gas to said process space above said substrate, said process space comprising a first process region above a substantially peripheral portion of said substrate and a second process region above a substantially central portion of said substrate, wherein said vapor distribution system is configured to adjust a distribution of the partial pressure of said dilution gas across said substrate between said first process region and said second process region;
a dilution gas source coupled to said vapor distribution system and configured to supply said dilution gas to at least one of said first process region or said second process region;
a vapor delivery system having a first end coupled to an outlet of said metal precursor vaporization system and a second end coupled to an opening of said vapor distribution system; and
a gas supply system coupled to at least one of said metal precursor vaporization system or said vapor delivery system, or both, and configured to supply a CO gas to transport said metal carbonyl precursor vapor in said CO gas to said inlet of said vapor distribution system,
wherein said vapor distribution system comprises:
a housing having said opening formed therein; a vapor distribution plate coupled to said housing and configured to face said substrate; an intermediate vapor distribution plate positioned within said housing between said opening and said vapor distribution plate, wherein the combination of said housing, said intermediate vapor distribution plate and said vapor distribution plate form a plenum between said opening and said intermediate vapor distribution plate and an intermediate plenum between said intermediate vapor distribution plate and said vapor distribution plate,
wherein said vapor distribution system is configured to receive said CO gas and said metal precursor vapor into said plenum through said opening formed in said housing,
wherein said intermediate vapor distribution plate includes a first array of openings formed therein and configured to distribute said CO gas and said metal precursor vapor from said plenum to said intermediate plenum,
wherein said dilution gas source is coupled to said intermediate plenum downstream of said plenum and is configured to supply said dilution gas to said intermediate plenum for diluting said CO gas and said metal precursor vapor that passes through said first array of openings into said intermediate plenum, and
wherein said vapor distribution plate includes a second array of openings formed therein and configured to re-distribute said CO gas and said metal precursor vapor with said dilution gas from said intermediate plenum to said process space above said substrate; and
a partition positioned within said intermediate plenum and configured to separate said intermediate plenum into a peripheral plenum region and a central plenum region, wherein said vapor distribution system is configured to receive said dilution gas into said peripheral plenum region, whereby said CO gas and said metal precursor vapor with said dilution gas are re-distributed to a substantially peripheral region of said process space through said openings in said vapor distribution plate.

2. The deposition system according to claim 1, wherein said dilution gas comprises an inert gas.

3. The deposition system according to claim 1, wherein said dilution gas comprises a noble gas.

4. The deposition system according to claim 1, wherein said gas supply system is further configured to supply an inert carrier gas to transport said metal carbonyl precursor vapor.

5. The deposition system according to claim 4, wherein said inert carrier gas comprises a noble gas.

6. The deposition system according to claim 1, wherein said substrate holder is configured to heat said substrate to a substrate temperature between about 50° C. and about 500° C.

7. The deposition system according to claim 1, wherein said substrate holder is configured to heat said substrate to a substrate temperature between about 200° C. and about 400° C.

8. The deposition system according to claim 1, wherein said pumping system is configured to evacuate said process chamber to a pressure ranging from approximately 0.1 mTorr to approximately 200 mTorr.

9. The deposition system according to claim 1, wherein said pumping system is configured to evacuate said process chamber to a pressure ranging from approximately 1 mTorr to approximately 100 mTorr.

10. The deposition system according to claim 1, wherein said metal carbonyl precursor comprises $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

11. The deposition system according to claim 1, wherein said metal precursor vaporization system is configured to heat said metal carbonyl precursor to a temperature between about 40° C. and about 150° C.

12. The deposition system according to claim 1, wherein said metal precursor vaporization system is configured to heat said metal carbonyl precursor to a temperature between about 60° C. and about 90° C.

13. A deposition system for forming a metal layer on a substrate, comprising:
  a process chamber having a substrate holder configured to support said substrate and heat said substrate, and a pumping system configured to evacuate said process chamber;
  a metal precursor vaporization system configured to vaporize a metal carbonyl precursor to form a metal carbonyl precursor vapor;
  a vapor distribution system coupled to or within said process chamber and configured to introduce said metal carbonyl precursor vapor to a process space above said substrate and a dilution gas to said process space above said substrate, said process space comprising a first process region above a substantially peripheral portion of said substrate and a second process region above a substantially central portion of said substrate, wherein said vapor distribution system is configured to adjust a distribution of the partial pressure of said dilution gas across said substrate between said first process region and said second process region;
  a dilution gas source coupled to said vapor distribution system and configured to supply said dilution gas to at least one of said first process region or said second process region;
  a vapor delivery system having a first end coupled to an outlet of said metal precursor vaporization system and a second end coupled to an opening of said vapor distribution system; and
  a gas supply system coupled to at least one of said metal precursor vaporization system or said vapor delivery system, or both, and configured to supply a CO gas to transport said metal carbonyl precursor vapor in said CO gas to said inlet of said vapor distribution system,
  wherein said vapor distribution system comprises:
  a housing having said opening formed therein; and a vapor distribution plate coupled to said housing and configured to face said substrate, wherein the combination of said housing and said vapor distribution plate form a plenum configured to receive said CO gas and said metal precursor vapor at a first concentration from said vapor delivery system through said opening formed in said housing, and wherein said vapor distribution plate comprises a plurality of through-holes formed therein and configured to distribute said CO gas and said metal precursor vapor to said process space above said substrate,
  wherein said vapor distribution plate comprises a first intermediate plenum formed in a first region thereof and a first array of orifices pneumatically coupling said first intermediate plenum to said first process region in said process space, and
  wherein said dilution gas source is coupled to said first intermediate plenum and said vapor distribution system is configured to receive said dilution gas into said first intermediate plenum at a first flow rate and said vapor distribution system is configured to distribute said dilution gas to said first process region through said first array of orifices for diluting said CO gas and said metal precursor vapor downstream of said through-holes to a second concentration lower than said first concentration in said first process region,
  wherein said vapor distribution plate further comprises a second intermediate plenum formed in a second region thereof and a second array of orifices pneumatically coupling said second intermediate plenum to said second process region in said process space, and wherein said dilution gas source is coupled to said second intermediate plenum and said vapor distribution system is configured to receive said dilution gas into said second intermediate plenum at a second flow rate and to distribute said dilution gas to said second process region through said second array of orifices for diluting said CO gas and said metal precursor vapor downstream of said through-holes to a third concentration lower than said first concentration in said second process region.

14. The deposition system according to claim 13, wherein said metal carbonyl precursor comprises $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

* * * * *

UNITED STATES PATENT AND TRADEMARK OFFICE
CERTIFICATE OF CORRECTION

| | | |
|---|---|---|
| PATENT NO. | : 7,892,358 B2 | |
| APPLICATION NO. | : 11/277913 | |
| DATED | : February 22, 2011 | |
| INVENTOR(S) | : Kenji Suzuki et al. | |

It is certified that error appears in the above-identified patent and that said Letters Patent is hereby corrected as shown below:

Cover Page, Col. 2, item (57) ABSTRACT, last line, "affect improvements" should read --effect improvements--.

Col. 2, line 31, "A method and system is provided" should read --A method and system are provided--.

Col. 5, line 64, "$Ru_3(CO)_x *(ad) \Leftrightarrow Ru_3(s)+xCO(g)$" should read --$Ru_3(CO)_x *(ad) \Leftrightarrow 3Ru(s)+ xCO(g)$--.

Col. 12, line 17, "to below to the upper" should read --to below the upper--.

Col. 13, line 2, "the combination form" should read --the combination forms--.

Col. 13, line 40, "plate 341 form" should read --plate 341 forms--.

Col. 14, lines 15-16, "the combination form" should read --the combination forms--.

Col. 14, lines 41-42, "the combination form" should read --the combination forms--.

Col. 15, line 5, "in order to affect" should read --in order to effect--.

Col. 15, lines 17-18, "the combination form" should read --the combination forms--.

Claim 1, Col. 18, line 17, "plate form" should read --plate forms--.

Claim 13, Col. 20, line 8, "plate form" should read --plate forms--.

Signed and Sealed this
Third Day of May, 2011

David J. Kappos
*Director of the United States Patent and Trademark Office*